(12) United States Patent
Mauder et al.

(10) Patent No.: US 7,812,427 B2
(45) Date of Patent: Oct. 12, 2010

(54) SOFT SWITCHING SEMICONDUCTOR COMPONENT WITH HIGH ROBUSTNESS AND LOW SWITCHING LOSSES

(75) Inventors: Anton Mauder, Kolbermoor (DE);
Hans-Peter Felsl, München (DE);
Manfred Pfaffenlehner, München (DE);
Hans-Joachim Schulze, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 714 days.

(21) Appl. No.: 11/757,451

(22) Filed: Jun. 4, 2007

(65) Prior Publication Data
US 2007/0278472 A1 Dec. 6, 2007

(30) Foreign Application Priority Data
Jun. 2, 2006 (DE) .................. 10 2006 025 958

(51) Int. Cl.
*H01L 29/06* (2006.01)
(52) U.S. Cl. ............... 257/653; 257/E29.005; 257/46; 257/11
(58) Field of Classification Search ............ 257/11, 257/46, 653, E29.005
See application file for complete search history.

(56) References Cited

U.S. PATENT DOCUMENTS
2005/0258455 A1* 11/2005 Schulze et al. ............. 257/213

FOREIGN PATENT DOCUMENTS
DE      10243758 A1    4/2004

* cited by examiner

*Primary Examiner*—Kiesha R Bryant
*Assistant Examiner*—Tucker Wright
(74) *Attorney, Agent, or Firm*—Edell, Shapiro & Finnan, LLC

(57) ABSTRACT

A semiconductor component includes a semiconductor body and a second semiconductor zone of a first conductivity type that serves as a rear side emitter. The second semiconductor zone is preceded by a plurality of third semiconductor zones of a second conductivity type that is opposite to the first conductivity type. The third semiconductor zones are spaced apart from one another in a lateral direction. In addition, provided within the semiconductor body is a field stop zone spaced apart from the second semiconductor zone, thereby reducing an electric field in the direction toward the second semiconductor zone.

22 Claims, 5 Drawing Sheets

SOFT SWITCHING SEMICONDUCTOR COMPONENT WITH HIGH ROBUSTNESS AND LOW SWITCHING LOSSES

CROSS REFERENCE TO RELATED APPLICATIONS

This application claims priority under 35 U.S.C. §119 to Application No. DE 102006025958.0 filed on Jun. 2, 2006, entitled "Soft Switching Semiconductor Component Having High Robustness and Low Switching Losses," the entire contents of which are hereby incorporated by reference.

BACKGROUND

In the field of semiconductor power electronics, endeavors are made to provide semiconductor devices with protection mechanisms in order that destruction of the semiconductor devices can be prevented even under extreme operating conditions.

Protection mechanisms of this type can be obtained in high-voltage freewheeling diodes by optimizing softness and robustness during a commutation operation. When an inductive load is turned off, chopping of a reverse current may occur, which may lead to overvoltage spikes and/or voltage oscillations that may be accompanied by destruction of the component. On the other hand, the reverse characteristic curve, that is to say the current/voltage characteristic curve of the freewheeling diode in reverse operation, may vary after hard commutation operations even though such a switching operation has not led to a hard failure of the component. Such variation of the reverse characteristic curve is manifested, for example, in an increase in the leakage current and is promoted for example by inhomogeneities in the rear side emitter and the rear side metal. Inhomogeneities of this type may occur in flat emitters produced by ion implantation, for example, by virtue of the fact that the area of the emitter is disturbed by small defects during the ion implantation or by spikes of a cathode metallization. In the case of implanted flat emitters, therefore, there are often inhomogeneities in their extent, whereby the emitter effect is attenuated.

The softness during the commutation operation was improved, for example, by introducing a more highly doped rear side emitter of the n type, but at the same time increased switching losses and possibly poorer switching robustness have to be accepted. Furthermore, proposals have been made for achieving a soft turn-off during the commutation of a semiconductor component such as a semiconductor diode or an IGBT by injection of charge carriers without fundamentally increasing the switching losses. In this case, a rear side emitter of the n conductivity type is preceded by so-called islands of the p conductivity type which together with the rear side emitter form a pn junction that breaks down before chopping of the diode reverse current occurs. As a result, the charge carriers generated via an avalanche mechanism continue to carry the load current and thus prevent the sudden current chopping, which leads to an alleviation of the harmful overvoltage spikes and/or oscillations. Via the hole injection, moreover, it is possible to prevent an electric field from building up at the nn$^+$ rear side structure given by a drift area of the n conductivity type and the rear side emitter of the n$^+$ conductivity type, whereby current chopping is likewise counteracted and the softness is thus improved.

A measure against characteristic curve rounding has been proposed by using stepped deep emitters. What is disadvantageous in that case, however, is that a measure taught therein cannot be combined with the abovementioned islands preceding the rear side emitter, since it is not possible to meet the boundary conditions in the dimensioning of the dopant areas of the emitter for setting the breakdown voltage of the pn junctions at the p-type islands.

SUMMARY

A semiconductor component such as, for example, a semiconductor diode, an IGBT (insulated gate bipolar transistor), a bipolar transistor and a thyristor, includes a semiconductor body and a second semiconductor zone of a first conductivity type serving as a rear side emitter. The second semiconductor zone is preceded by a plurality of third semiconductor zones of a second conductivity type that is opposite to the first conductivity type. The third semiconductor zones being spaced apart from one another in a lateral direction. Moreover, provided within the semiconductor body is a field stop zone spaced apart from the second semiconductor zone, thereby reducing an electric field in the direction toward the second semiconductor zone.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
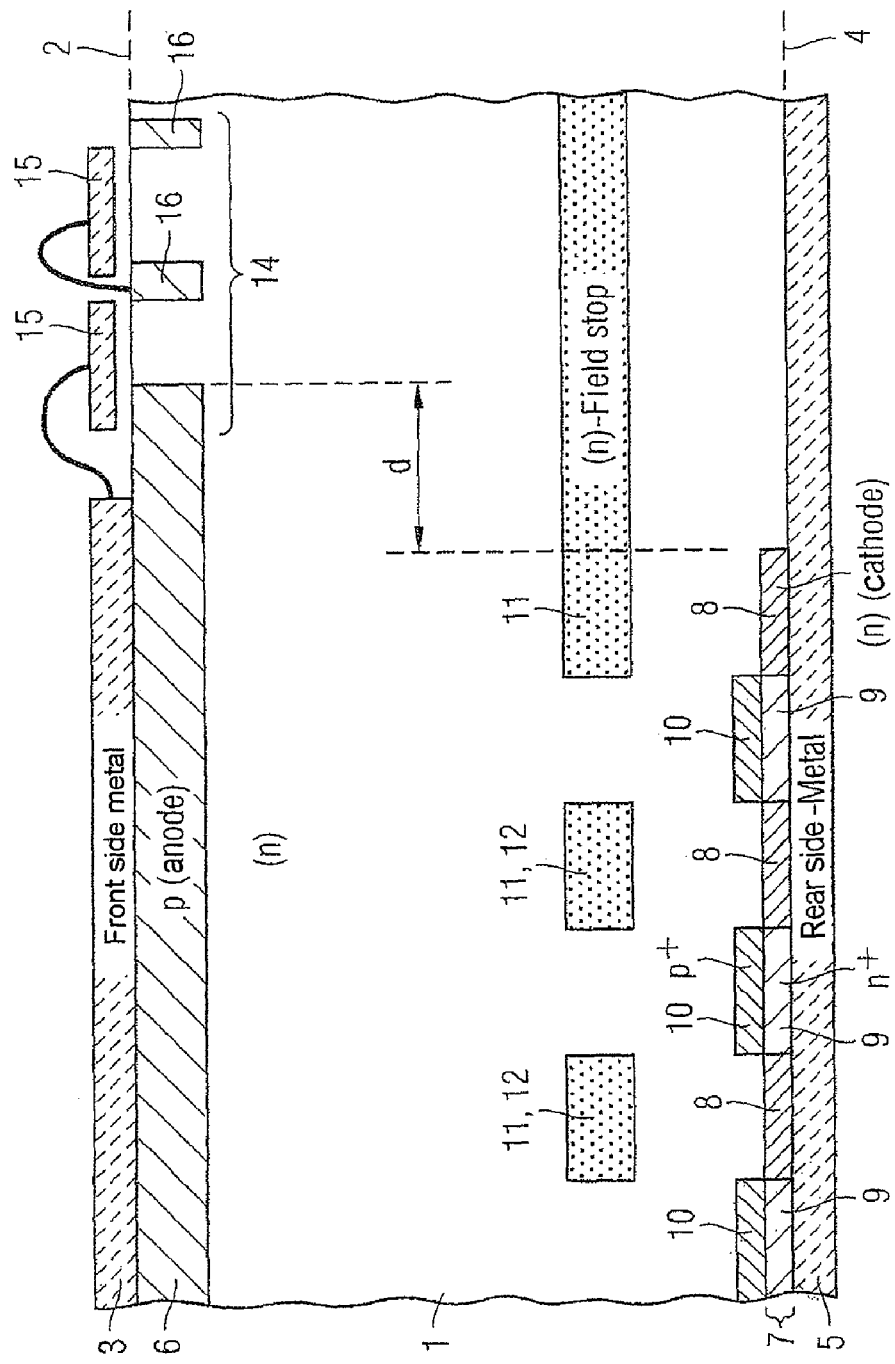
FIG. 1 shows a schematic cross-sectional view through a diode according to a first exemplary embodiment.

A semiconductor component is described herein that includes favorable properties with regard to softness and robustness during commutation operations in combination with low switching losses.

A semiconductor component in accordance with one exemplary embodiment comprises a semiconductor body of a first conductivity type, in which is formed, between a first electrode and a second electrode extending in a lateral direction, at least one first semiconductor zone of a second conductivity type, which is opposite to the first conductivity type. The at least one first semiconductor zone adjoins the first electrode. A second semiconductor zone of the first conductivity type is formed in the semiconductor body. The second semiconductor zone includes first and second zone regions alternating in the lateral direction, where the first zone regions have a lower dopant concentration than the second zone regions. The semiconductor body further comprises a plurality of third semiconductor zones of the second conductivity type. The third semiconductor zones are spaced apart from another and are likewise arranged in the lateral direction, wherein the second zone regions in each case adjoin the third semiconductor zones vertically in the direction toward the first electrode.

As described herein, the lateral direction defines the direction along which the second electrode extends, where the second electrode may be directed along an arbitrary surface of the semiconductor body.

The first conductivity type may be an n conductivity type, such that the second conductivity type corresponds to a p conductivity type. An inverse assignment of n conductivity and p conductivity type to the first and second conductivity types is likewise possible.

The first and second electrodes may be formed, for example, at opposite surfaces of the semiconductor body. These are preferably formed from a material having a lowest possible contact resistance with respect to the semiconductor body. For example, the first and second electrodes can be formed from a metallic material or from a combination of a metallic material and metal silicides or metal nitrides. Further material combinations are also possible in accordance with the invention.

Between the third semiconductor zones and the second zone regions pn junctions are formed. The third semiconductor zones may be regarded as islands preceding the second semiconductor zone, the second semiconductor zone representing a rear side emitter. On one hand, via a configuration of the third semiconductor zones and also of the second zone regions of the second semiconductor zone, it is possible to establish a breakdown voltage of the assigned pn junctions with regard to an improved softness during commutation by optimizing the avalanche generation. On the other hand, by choosing the more lightly doped first zone regions in comparison with the second zone regions, it is possible to reduce an emitter efficiency of the rear side emitter, which has an advantageous effect with regard to the turn-off losses. Consequently, it is possible to optimize and adapt the second semiconductor zone at the rear side independently to the different requirements of a rear side emitter and also to a dimensioning of the preceding third semiconductor zones as islands and of the pn junctions linked therewith. In this case, what has a positive effect in particular is that the switching losses, for example, during slow switching or during turn-off of very high currents, can be designed to be very low on account of the comparatively weak rear side emitter, from which a particularly advantageous operating point of a diode can be specified. In this context it should be taken into account that the more lightly doped zone regions in comparison with the second zone regions act as rear side emitter.

Since the electric field during each commutation operation reaches very far in the direction of the rear side emitter, a tail current of the diode as a result of avalanche multiplication at the pn junctions between the third semiconductor zones and the second zone regions is adapted to the prevailing conditions of the application such as, for example, the turn-on speed of the commutating switch or the leakage inductance present during the switching operation currently being carried out. Moreover, the injected holes generated at the pn junction prevent an electric field from being built up at the nn$^+$ junction between a drift zone in the semiconductor body and the second semiconductor zone and these therefore additionally counteract plasma reduction on the rear side, whereby the softness during the commutation operation is improved further. By virtue of such "self-regulating" hole injection in the semiconductor component, a chip based thereon can be taken as a basis for various applications, the chip automatically being adapted to the boundary conditions in conjunction with low switching losses. A problem with regard to a surge current strength in semiconductor components with a weak rear side emitter can be diminished by a suitable choice of the dopant concentrations in the preceding third semiconductor zones formed as islands since these can be flooded given sufficient charge carrier flooding in forward operation and the more highly doped second zone regions in comparison with the first zone regions are involved in the charge carrier injection of the rear side emitter and increase the rear side emitter efficiency.

In a further embodiment, the second zone regions are formed congruently with respect to the third semiconductor zones in the lateral direction. For example, the second zone regions and also the third semiconductor zones may be formed via a common patterning step. Thus, both regions may be formed by a respective implantation using a common implantation mask such as, for example, a resist or a hard mask. Since the first zone regions are more lightly doped in comparison with the second zone regions, these may be formed in continuous fashion and be correspondingly overdoped during the formation of the second zone regions.

Moreover, the third semiconductor zones may project beyond the second zone regions at least in specific regions in the lateral direction. As a result of this, the contribution of the more highly doped second zone regions in comparison with the first zone regions to the emitter efficiency during commutation can be reduced further since, in particular, an injection of the second zone regions is attenuated in the region of their lateral edge regions.

The first and second zone regions can have, for example, lateral dimensions that are from 2 μm to 40 μm.

For example, a field stop zone of the first conductivity type having a higher dopant concentration in comparison with the semiconductor body is formed, where the field stop zone is embedded into the semiconductor body and is spaced apart from the second semiconductor zone. Consequently, the field stop zone is formed as a field stop zone that is buried within the semiconductor body. The task of the field stop zone is to realize a reduction of an electric field in reverse operation in a more confined space in comparison with a drift zone of the semiconductor body. The field stop zone may be realized, for example, via a deep implantation, for instance via proton-induced donors.

The field stop zone may likewise be formed as a sequence of field stop zone areas that are adjacent in the lateral direction. In this case, it is advantageously possible to influence the profile of equipotential lines and to obtain a coordination with respect to the spatially alternate third semiconductor zones and also the first and second zone areas with regard to advantageous component properties.

In this context, it may be advantageous for the field stop zone areas to be formed laterally congruently with respect to the first zone regions. Likewise, the field stop zone areas may project laterally beyond the first zone regions or the first zone regions may project laterally beyond the field stop zone areas. An appropriate arrangement can be specified by optimizing the electric field profile or else the rear side emitter efficiency.

It may likewise be advantageous for the field stop zone to be formed in laterally continuous fashion. In this case, it is possible, for example, to achieve cost savings by using a lithography mask that is already present in the process sequence. However, a dedicated mask may also be provided for the field stop zone.

It may be advantageous if dopants that form the second zone regions correspond to an effective dose of dopant that is from $4 \times 10^{14}$ cm$^{-2}$ to $1 \times 10^{16}$ cm$^{-2}$.

It may likewise be advantageous if dopants that form the first zone regions correspond to an effective dose of dopant that is from $1\times10^{12}$ cm$^{-2}$ to $4\times10^{14}$ cm$^{-2}$.

A dopant concentration at the surface of the semiconductor body may in this case be at least $10^{19}$ cm$^{-3}$ in order to ensure an ohmic contact of a rear side metal to the first and second zone regions.

In accordance with a further embodiment, a semiconductor component comprises a semiconductor body of a first conductivity type, in which is formed, between a first electrode and a second electrode extending in a lateral direction, at least one first semiconductor zone of a second conductivity type, which is opposite to the first conductivity type, the at least one first semiconductor zone adjoining the first electrode. Provision is likewise made of a second semiconductor zone of the first conductivity type, which second semiconductor zone is formed within the semiconductor body and of a plurality of third semiconductor zones of the second conductivity type that are spaced apart from one another in the lateral direction and join the second semiconductor zone in the direction toward the second electrode. Provision is additionally made of a field stop zone of the first conductivity type having a higher dopant concentration in comparison with the semiconductor body, wherein the field stop zone is embedded into the semiconductor body, is spaced apart from the second semiconductor zone and is formed as a sequence of field stop zone areas that are adjacent in the lateral direction. Consequently, this semiconductor component lacks, in comparison with the semiconductor component of the first aspect described further above, with regard to the second semiconductor zone, the first and second zone regions which alternate in the lateral direction and which differ in terms of the dopant concentration. Depending on the dopant concentration of the second semiconductor zone, therefore, the advantage of the lower turn-off losses can no longer be achieved to the extent that is possible in the case of the above semiconductor component including the alternate first and second zone regions. Advantageous properties can nevertheless be obtained with regard to robustness and soft switching.

The third semiconductor zones can have lateral dimensions from 2 μm to 40 μm and a lateral distance between two adjacent third semiconductor zones that is from 2 μm to 40 μm.

In a further embodiment, the field stop zone is at a distance from the second electrode that is from 1 μm to 50 μm.

Dopants that form the third semiconductor zones may correspond to an effective dose of dopant that is from $4\times10^{12}$ cm$^{-2}$ to $1\times10^{15}$ cm$^{-2}$. Through a suitable choice of the effective dose of the third semiconductor zones, the inception instant of avalanche generation of the pn junction between the third semiconductor zones and the second zone regions can be optimally adapted to the requirements of a commutation operation. Typical maximum dopant concentrations in the third semiconductor zones are from approximately $1\times10^{15}$ cm$^{-3}$ to $1\times10^{18}$ cm$^{-3}$ or else from approximately $1\times10^{15}$ cm$^{-3}$ to $5\times10^{16}$ cm$^{-3}$. The vertical extent of the third semiconductor zones lies, for example, from approximately 2 μm to 20 μm.

In a further embodiment, a semiconductor component comprises an edge termination region laterally adjoining the first semiconductor zone, where an outer edge or lateral end of the second semiconductor zone is at a lateral distance from the edge termination region which corresponds to at least double a value of an ambipolar diffusion length in the semiconductor body.

The edge termination region may comprise, for example, a plurality of field plates and assigned edge termination zones adjacent to the first electrode or first semiconductor zone in order to realize a lateral field reduction in a desired manner. Consequently, in this embodiment, the second semiconductor zone acting as rear side emitter is not formed below the edge termination region, for which reason the injection of charge carriers into the edge termination region is reduced and an increase in the switching robustness is consequently obtained. A distance between the rear side emitter and the edge termination region corresponding to at least twice the ambipolar diffusion length brings about an improvement in robustness. It is advantageous in this context for recombination centers serving as "lifetime killers" to be incorporated into the semiconductor body in order thereby to obtain a reduction of the ambipolar diffusion length and thus to minimize a chip area requirement associated with the distance between the rear side emitter and the edge termination region.

In accordance with a further embodiment, the first zone regions extend into an edge termination region of the semiconductor component and the second zone regions are omitted in the edge termination region.

In accordance with a further exemplary embodiment, the third semiconductor zones extend into an edge termination region of the semiconductor component.

In a further embodiment, an auxiliary zone area of the first conductivity type, the dopant concentration of which is higher in comparison with the semiconductor body, is embedded between the field stop zone and the second electrode. The auxiliary zone area has for example a lower dopant concentration in comparison with the second semiconductor zone and field stop zone.

In a further embodiment, at least one further semiconductor zone of the first conductivity type adjoining the first electrode is embedded within the first semiconductor zone. The at least one further semiconductor zone may represent for example an emitter of a bipolar transistor, the first semiconductor zone forming a base and the second semiconductor zone forming a collector of the bipolar transistor. The further semiconductor zone may likewise be part of a semiconductor component formed as a thyristor.

As an alternative to this or supplementary, an additional semiconductor zone of the second conductivity type is arranged between the second electrode and the second semiconductor zone. It is thereby possible to realize an IGBT, by way of example.

The semiconductor component may be, for instance, a diode, a bipolar transistor, an IGBT, a MOSFET (metal oxide semiconductor field effect transistor) or else a thyristor.

In a further embodiment, a field stop zone of the first conductivity type having a higher dopant concentration in comparison with the semiconductor body is formed, wherein the field stop zone adjoins the second semiconductor zone and the third semiconductor zones are at least partially embedded within the field stop zone.

All of the ranges of values described serve merely as an example and do not constitute any restriction.

Exemplary embodiments of semiconductor components are now described with reference to the figures.

FIG. 1 shows a schematic cross-sectional view of a diode in accordance with a first exemplary embodiment. The diode may be used, for example, as a freewheeling diode for commutation operations of inductive loads. Electrical contact is made with a semiconductor body 1 at a first surface 2 by a first electrode 3. The first electrode 3 may be formed as a metal, for example. In addition, electrical contact is made with the semiconductor body 1 at a second surface 4 by a second electrode 5. A first semiconductor zone 6 of the p conductivity type, the first semiconductor zone 6 serving as anode, is formed within the semiconductor body 1 and adjoins the first electrode 3.

Adjoining the second electrode 5, a second semiconductor zone 7 of the n conductivity type is formed within the semiconductor body 1, the second semiconductor zone 7 serving as rear side emitter and having alternate first and second zone regions 8, 9 in the lateral direction. The first zone regions 8 are doped weaker than the second zone regions 9. Furthermore, a plurality of third semiconductor zones 10 of the $p^+$ conductivity type are formed within the semiconductor body 1, the third semiconductor zones 10 being spaced apart from one another in the lateral direction and adjoining the second zone regions 9 and thereby forming with the second zone regions 9 pn junctions connected to the second electrode 5. The third zone regions 10 lie approximately congruently with respect to the second zone regions 9 in the lateral direction.

The diode additionally has a field stop zone 11, which is embedded into the semiconductor body 1 and is spaced apart from the second semiconductor zone 7. The field stop zone 11 has a higher dopant concentration in comparison with the semiconductor body 1. The field stop zone is likewise formed in part as a sequence of adjacent field stop zone areas 12 in the lateral direction. The field stop zone areas 12 lie above the first zone regions 8 and are aligned or approximately congruent with respect to the first zone regions in the lateral direction.

That part of the semiconductor body 1 which is doped more lightly in comparison with the introduced semiconductor zones between the semiconductor zone 6 and the field stop zone 11 or the second semiconductor zone 7 is referred to as a base zone in the case of diodes and as a drift zone in the case of IGBTs.

An edge termination region 14 of the semiconductor component follows adjacent to the first semiconductor zone 6 serving as anode. The edge termination region 14 includes at least one or a plurality of field plates 15 and also edge termination zones 16 of the p conductivity type, wherein the edge termination zones 16 reach the first surface 2 and electrically connect to a suitable field plate 15. The edge termination region 14 is intended to ensure an advantageous lateral reduction of the electric field.

The field stop zone 11 is formed in continuous fashion (i.e., is continuous) below the edge termination region 14.

However, the second semiconductor zone 7 serving as rear side emitter does not extend as far as below the edge termination region 14, but rather terminates or has an end that is at a distance d from the edge termination region in the lateral direction. This makes it possible to reduce a charge carrier injection from the rear side emitter into the edge termination region 14, which serves for increased switching robustness. The distance d is preferably chosen to be at least twice as large as an ambipolar diffusion length in the semiconductor body 1. The ambipolar diffusion length, for its part, can be reduced for example by introducing into the semiconductor body recombination centers serving as "lifetime killer", which leads to an advantageous saving of chip area.

On account of the third semiconductor zones 10 preceding the second zone regions 9, primarily the comparatively weakly doped first zone regions 8 relative to the second zone regions 9 serve as a rear side emitter at least in the case of current densities that are not excessively high (in the case of very high current densities, the effect of the third semiconductor zones on the forward voltage is very largely negligible). Consequently, the switching losses can be kept low on account of the low rear side emitter efficiency associated with this. Since the electric field during each commutation operation reaches very far in the direction of the second semiconductor zone 7, a tail current of the diode on account of an avalanche multiplication at the pn junctions of the second zone regions 9 and the third semiconductor zones 10 is provided which is adapted to the conditions of the application that prevail during operation, such as, for instance, the turn-on speed of the commutating switch or the leakage inductance present during the switching operation just carried out. In addition, the injected holes generated by avalanche generation between the second zone regions 9 and the third semiconductor zones 10 prevent or delay a build-up of an electric field toward the second semiconductor zone 7 and toward the first semiconductor zone 8, which entails an additional improvement with regard to the softness of the switching operation.

It is furthermore advantageous that, on account of the wide punch-through of the electric field during turn-off in the direction of the $p^+/n^+$ areas formed from the third semiconductor zones 10 and the second zone regions 9, an avalanche multiplication that occurs essentially homogeneously at these pn junctions commences and an anchoring of current filaments at location defects is consequently made more difficult or avoided. This counteracts characteristic curve rounding as a result of leakage current increase during hard commutation operations and achieves an improvement with regard to the robustness of the diode. In addition to the third semiconductor zones 10, the preceding field stop zone areas 12 support the electric field reduction on the rear side and counteract a possible current splitting in the direction of the first zone regions 8. The diode of this exemplary embodiment may accordingly be regarded as a combination of static and dynamic field stop.

Figure 2:
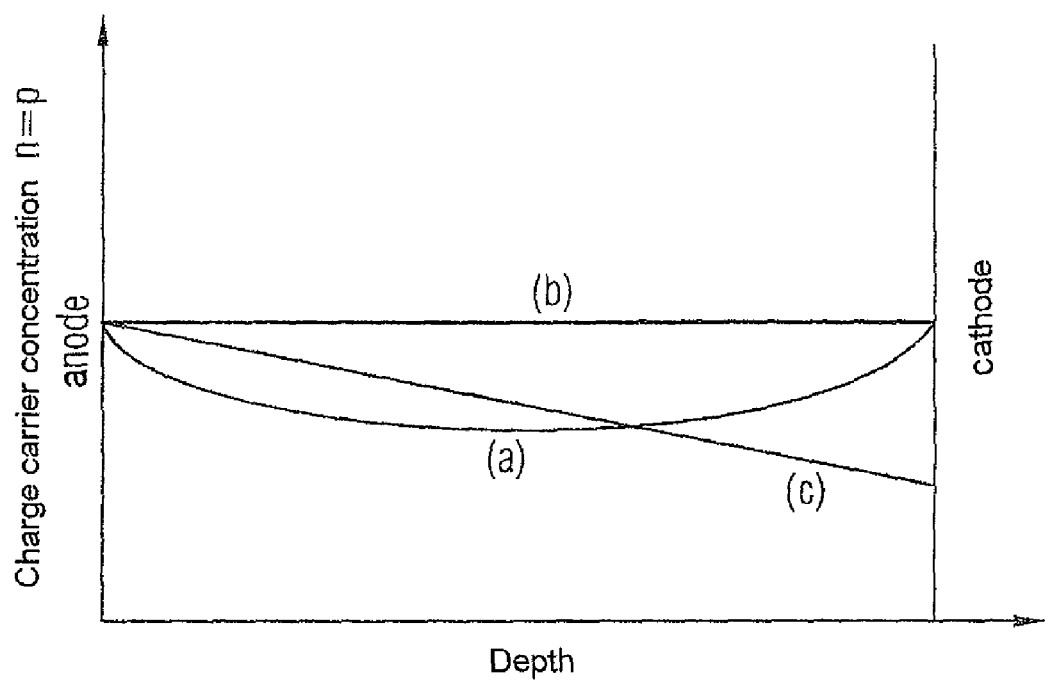
FIG. 2 shows a schematically illustrated charge carrier profile between anode and cathode of the diode of the first exemplary embodiment.

FIG. 2 schematically illustrates the charge carrier concentration of electrons and holes between the first semiconductor zone 6 serving as an anode and the second semiconductor zone 7 serving as a cathode of the first exemplary embodiment (see FIG. 1) in the forward state of the diode. A charge carrier concentration of electrons and holes n=p is plotted against a depth of the diode. According to the schematic curve profile (a), in the case of recombination centers introduced into the semiconductor body 1 which serve as a so-called "lifetime killer", a charge carrier flooding with electrons and holes results. Dispensing with such recombination centers for reducing the diffusion length yields concentration profiles of electrons and holes n=p such as are shown in the schematic curves (b) and (c). On account of the tail current that is regulated via an electrical breakdown of the $n^+/p^+$ junctions formed from the second zone regions 9 and third semiconductor zones 10, it is possible to dispense with such recombination centers in order to obtain an improved softness or to considerably reduce their number in comparison with a conventional diode. Since the $n^+$-type areas 9 below the third semiconductor zones 10 serving as preceding islands only make an extremely weak contribution to the injection of the diode in the forward case, these can be set optimally in respect of their dopant concentration with regard to an improvement of the switching properties, for instance with regard to the commencement of an avalanche multiplication of charge carrier pairs at the pn junction between the second semiconductor zones 9 and the third semiconductor zones 10.

Figure 3:
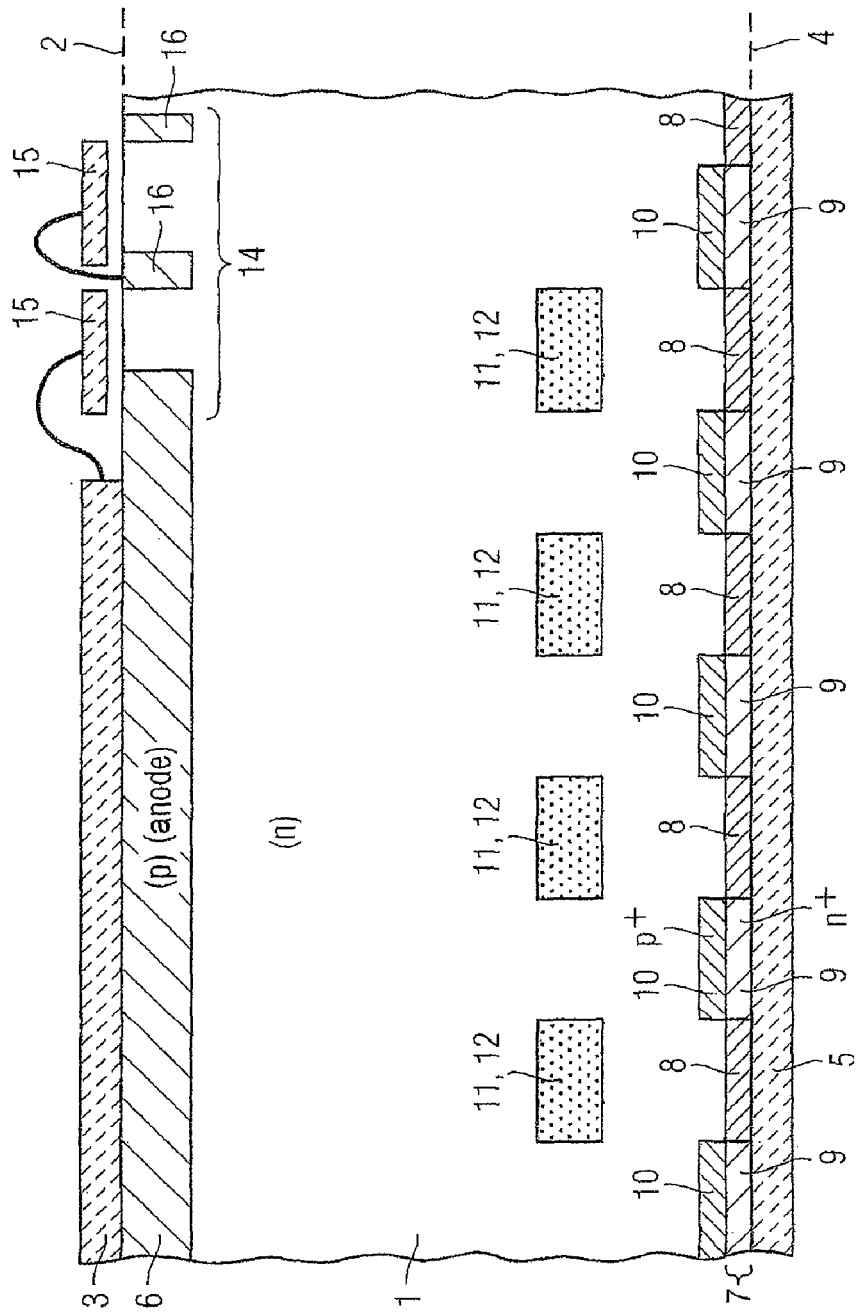
FIG. 3 shows a schematic cross-sectional view through a diode according to a second exemplary embodiment.

FIG. 3 shows a schematic cross-sectional view of a diode in accordance with a second exemplary embodiment. Components of the embodiment of FIG. 3 (and also subsequent exemplary embodiments) that are the same or similar to the first exemplary embodiment described above and depicted in FIG. 1 are provided with the same reference symbols hereinafter. A repetition again of the description of the same components is therefore not provided, since it is to be understood that reference can be made to the description above relating to corresponding parts of FIG. 1.

The second exemplary embodiment shown in FIG. 3 differs from the first exemplary embodiment shown in FIG. 1 by virtue of the fact that the rear side emitter, i.e., the second semiconductor zone 7, and also the third semiconductor zones 10 are formed further in the lateral direction so as to be below the edge termination region 14. Likewise, unlike in the first exemplary embodiment, the field stop zone 11 below the edge termination region 14 is not formed in continuous fashion (i.e., is not continuous in the lateral distance that is below termination region 14), but rather extends into the edge termination region 14 in the grid pattern of the adjacent sequence of field stop zone areas 12 in the lateral direction.

Figure 4:
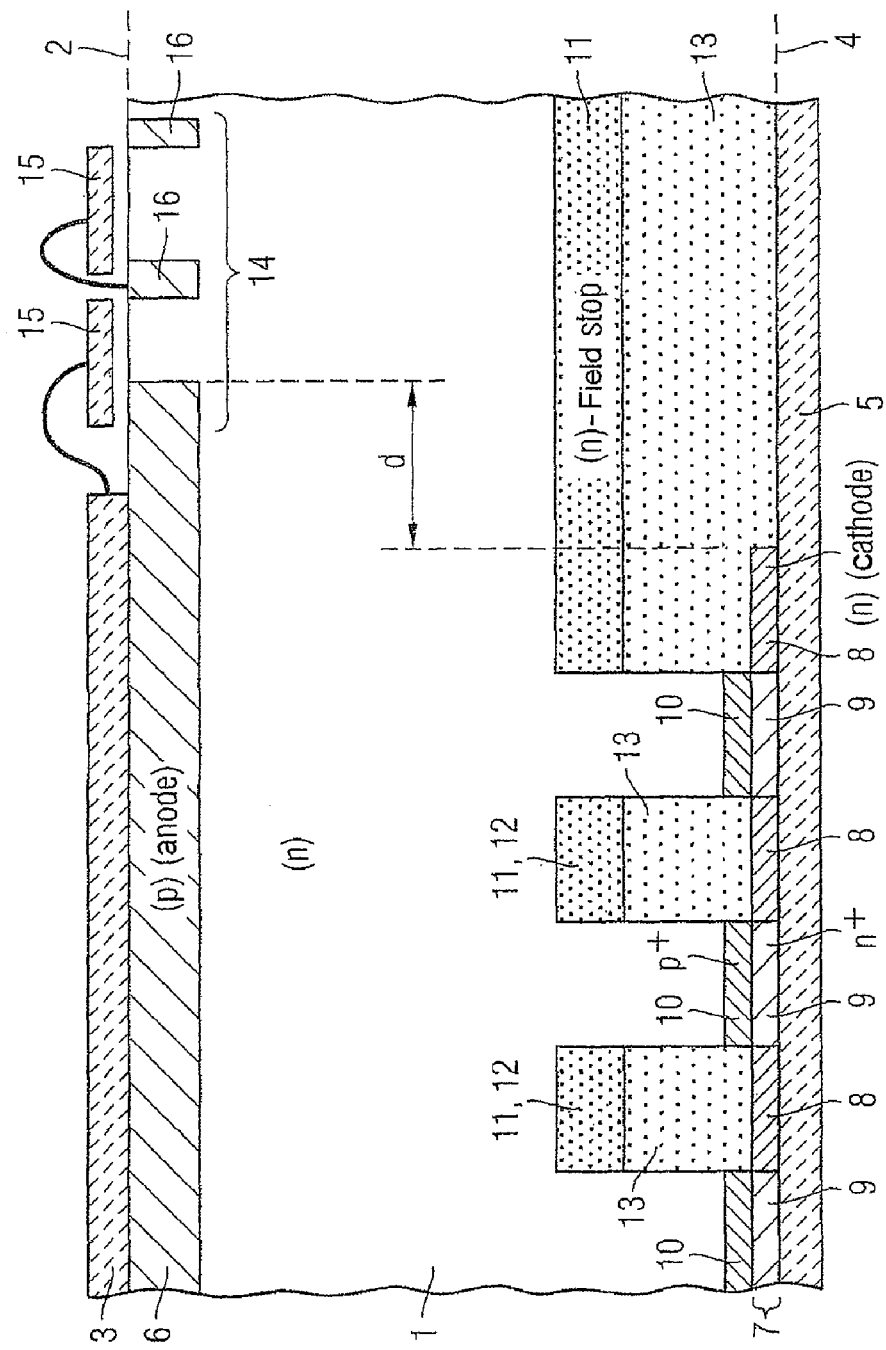
FIG. 4 shows a schematic cross-sectional view through a diode according to a third exemplary embodiment.

FIG. 4 illustrates a schematic cross-sectional view of a diode in accordance with a third exemplary embodiment. This diode differs from the first exemplary embodiment shown in FIG. 1 by virtue of the fact that auxiliary zone areas 13 of the conductivity type of the semiconductor body 1 are embedded between the field stop zone 11 and the second electrode 5, the auxiliary zone areas 13 lying beneath and being aligned and congruent with respect to the field stop zone 11 in the lateral direction. The auxiliary zone areas 13 serve for reducing the electric field toward the rear side, i.e., toward the second electrode 5, and are preferably doped greater than the semiconductor body 1, but are preferably doped less than the field stop zone 11 and also doped less than the first zone regions 8 acting as rear side emitter.

Figure 5:
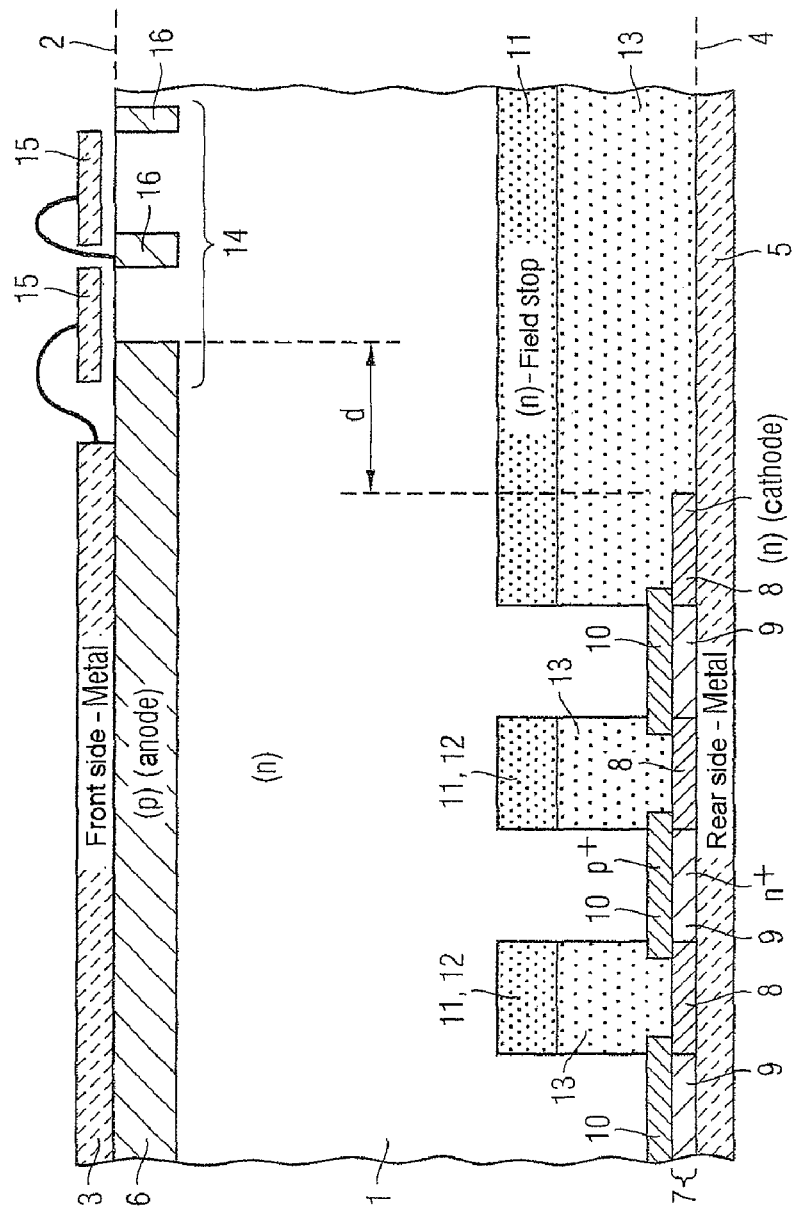
FIG. 5 shows a schematic cross-sectional view through a diode according to a fourth exemplary embodiment.

FIG. 5 shows a schematic cross-sectional view of a diode of a fourth exemplary embodiment. In contrast to the third exemplary embodiment shown in FIG. 4, here the third semiconductor zones 10 are formed as preceding islands that project laterally beyond the second zone regions 9 (i.e., the third semiconductor zones 10 project in the lateral direction so as to extend further in a lateral direction beyond second zone regions 9). This leads to a further suppression of a charge carrier injection from lateral regions of the second zone regions 9 assigned to the rear side emitter. In addition, the field stop zone areas 12 and also the associated auxiliary zone areas 13 are formed in such a way that these project laterally beyond the first zone areas 8. Alternatively, it is noted that an embodiment can be provided in which only one of the following is provided: the semiconductor zones 10 project laterally beyond (and are thus have lateral ends that are not aligned or congruent with lateral ends of) the second zone regions 9; or the field stop zone areas 12 and also the associated auxiliary zone areas 13 project laterally beyond (and thus have lateral ends that are not aligned or congruent with lateral ends of) the first zone areas 8.

It is likewise possible to realize an unpatterned, but easier to produce continuous field stop zone 11. It may likewise be advantageous in the dimensioning of the diode to omit the field stop zone 11 in an edge or central region.

As an alternative to buried field stop zones, the field stop zone 11 may also directly adjoin the second semiconductor zone 7 and the third semiconductor zones 10 are incorporated into the field stop zone 11 in this case. Such field stop zones can be produced for example by indiffusion from the surface or by ion implantation with a subsequent drive-in step.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A semiconductor component, comprising:
   a first electrode;
   a second electrode that extends in a lateral direction in relation to the semiconductor component; and
   a semiconductor body of a first conductivity type, the semiconductor body comprising:
      at least one first semiconductor zone of a second conductivity type arranged between the first and second electrodes and adjoining the first electrode, the second conductivity type being opposite to the first conductivity type;
      a second semiconductor zone of the first conductivity type, including a plurality of first zone regions and second zone regions arranged in an alternating manner with respect to each other in the lateral direction, wherein the first zone regions have a lower dopant concentration than the second zone regions; and
      a plurality of third semiconductor zones of the second conductivity type arranged at spaced apart locations from each other in the lateral direction, wherein each of the third semiconductor zones adjoins a corresponding second region of the second semiconductor zone such that at least a portion of each second region of the second semiconductor zone is disposed between a corresponding third semiconductor zone and the second electrode.

2. The semiconductor component according to claim 1, wherein at least some of the second zone regions include lateral ends that are aligned with lateral ends of corresponding third semiconductor zones.

3. The semiconductor component according to claim 1, wherein at least some of the third semiconductor zones include lateral ends that extend in the lateral direction beyond lateral ends of corresponding second zone regions.

4. The semiconductor component according to claim 1, wherein each of the first and second zone regions of the second semiconductor zone has a lateral dimension from 2 µm to 40 µm.

5. The semiconductor component according to claim 1, further comprising:
   a field stop zone of the first conductivity type embedded in the semiconductor body and that is spaced apart from the second semiconductor zone, wherein the field stop zone has a greater dopant concentration than the semiconductor body.

6. The semiconductor component according to claim 5, wherein the field stop zone comprises:
   a plurality of field stop zone areas arranged separated from each other and aligned in the lateral direction.

7. The semiconductor component according to claim 6, wherein the field stop zone areas are spaced apart from and aligned with the first zone regions in the lateral direction.

8. The semiconductor component according to claim 6, wherein the field stop zone areas include lateral ends that extend in the lateral direction beyond lateral ends of corresponding first zone regions.

9. The semiconductor component according to claim 5, wherein the field stop zone is laterally continuous.

10. The semiconductor component according to claim 1, wherein the second zone regions are doped to an effective dose that is from $4 \times 10^{14}$ cm$^{-2}$ to $1 \times 10^{16}$ cm$^{-2}$.

11. The semiconductor component according to claim 1, wherein the first zone regions are doped to an effective dose that is from $1 \times 10^{12}$ cm$^{-2}$ to $4 \times 10^{14}$ cm$^{-2}$.

12. The semiconductor component according to claim 1, wherein each of the third semiconductor zones has a lateral dimension from 2 µm to 40 µm, and a lateral distance between two adjacent third semiconductor zones is from 2 µm to 40 µm.

13. The semiconductor component according to claim 1, wherein the third semiconductor zones are doped to an effective dose that is from $4\times10^{12}$ cm$^{-2}$ to $1\times10^{15}$ cm$^{-2}$.

14. The semiconductor component according to claim 1, further comprising:
    an edge termination region that laterally adjoins the first semiconductor zone, wherein a lateral end of the second semiconductor zone is disposed a distance in the lateral direction from the edge termination region that is at least double a value of an ambipolar diffusion length in the semiconductor body.

15. The semiconductor component according to claim 1, further comprising:
    an edge termination region that laterally adjoins the first semiconductor zone, wherein at least one first zone region extends a sufficient distance in the lateral direction in which the edge termination region is located within the semiconductor component, and no second zone regions extend in the lateral direction in which the edge termination region is located within the semiconductor component.

16. The semiconductor component according to claim 1, further comprising:
    an edge termination region that laterally adjoins the first semiconductor zone, wherein at least one third semiconductor zone extends a sufficient distance in the lateral direction in which the edge termination region is located within the semiconductor component.

17. The semiconductor component according to claim 1, further comprising:
    at least one further semiconductor zone embedded in the first semiconductor zone, the at least one further semiconductor zone adjoining the first electrode and being of the first conductivity type.

18. The semiconductor component according to claim 1, further comprising:
    an additional semiconductor zone of the second conductivity type arranged between the second electrode and the second semiconductor zone.

19. The semiconductor component according to claim 1, wherein the semiconductor component comprises a component selected from the group consisting of a diode, a MOSFET, an IGBT and a thyristor.

20. The semiconductor component according to claim 1, further comprising:
    a field stop zone adjoining the second semiconductor zone, the field stop zone being of the first conductivity type and having a greater dopant concentration than the semiconductor body, wherein the third semiconductor zones are at least partially embedded in the field stop zone.

21. The semiconductor component according to claim 5, wherein the field stop zone is arranged at a distance from the second electrode from 1 µm to 50 µm.

22. The semiconductor component according to claim 21, further comprising:
    an auxiliary zone area embedded between the field stop zone and the second electrode, the auxiliary zone area being of the first conductivity type and having a greater dopant concentration than the semiconductor body.

* * * * *